(12) United States Patent
Hata

(10) Patent No.: US 9,267,985 B2
(45) Date of Patent: Feb. 23, 2016

(54) BOND AND PROBE PAD DISTRIBUTION

(75) Inventor: William Y. Hata, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 212 days.

(21) Appl. No.: 12/534,002

(22) Filed: Jul. 31, 2009

(65) Prior Publication Data

US 2011/0025359 A1 Feb. 3, 2011

(51) Int. Cl.
*G01R 31/02* (2006.01)
*G01R 31/28* (2006.01)
*H01L 21/66* (2006.01)
*H01L 23/00* (2006.01)

(52) U.S. Cl.
CPC ............ *G01R 31/2884* (2013.01); *H01L 22/32* (2013.01); *H01L 24/05* (2013.01); *H01L 2224/02166* (2013.01); *H01L 2224/04042* (2013.01); *H01L 2224/05553* (2013.01); *H01L 2224/05554* (2013.01); *H01L 2224/0603* (2013.01); *H01L 2224/48091* (2013.01); *H01L 2924/01005* (2013.01); *H01L 2924/14* (2013.01)

(58) Field of Classification Search
CPC ............ G01R 31/2884; H01L 21/3043; H01L 23/544
USPC ................. 324/762.01–762.09; 438/14–18; 257/773, 781
See application file for complete search history.

(56) References Cited

U.S. PATENT DOCUMENTS

| | | | |
|---|---|---|---|
| 5,398,696 A | 3/1995 | Wiley | |
| 5,399,983 A * | 3/1995 | Nagasawa | 324/750.19 |
| 5,616,931 A * | 4/1997 | Nakamura et al. | 257/48 |
| 5,904,639 A | 5/1999 | Smyser et al. | |
| 6,437,364 B1 | 8/2002 | Wu | |
| 6,445,001 B2 * | 9/2002 | Yoshida | 257/48 |
| 6,605,951 B1 | 8/2003 | Cowan | |
| 7,595,557 B2 * | 9/2009 | Watase et al. | 257/773 |
| 2002/0132655 A1 | 9/2002 | Mercer et al. | |
| 2002/0135055 A1 | 9/2002 | Cho et al. | |
| 2007/0241330 A1 | 10/2007 | Nishimura et al. | |
| 2009/0174051 A1 | 7/2009 | Osaka et al. | |

FOREIGN PATENT DOCUMENTS

| | | |
|---|---|---|
| CN | 1077026 | 10/1993 |
| CN | 1910750 A | 2/2007 |
| CN | 101419111 | 4/2009 |
| JP | 2005209882 | 8/2005 |

OTHER PUBLICATIONS

Written Opinion of the International Searching Authority and International Search Report, PCT/US2010/043137, mailed Feb. 18, 2011.

* cited by examiner

*Primary Examiner* — Tung X Nguyen
(74) *Attorney, Agent, or Firm* — Womble Carlyle Sandridge & Rice LLP

(57) ABSTRACT

An integrated circuit (IC) that includes a plurality of bond pads disposed on a surface of the IC and a plurality of probe pads disposed on the surface of the IC is provided. Each of the plurality of probe pads is in electrical communication with corresponding bond pads. The plurality of probe pads are linearly configured across the surface. In one embodiment, the probe pads are disposed along a diagonal of the surface of the die defined between opposing vertices of the die surface. In another embodiment, multiple rows of linearly disposed probe pads are provided on the surface.

18 Claims, 8 Drawing Sheets

BOND AND PROBE PAD DISTRIBUTION

BACKGROUND

Improvements in semiconductor processing technology have resulted in integrated circuit chips which are more densely populated with microelectronic elements and which provide more functionality than ever before. Furthermore, the aggressive development of semiconductor technology and the accompanying need for higher device integration has enabled current state-of-the-art chips to integrate entire systems on a single small semiconductor die. The need to provide all the possible interconnections to these feature laden chips remains a challenge in the packaging industry, as all the required pads compete for the small peripheral space around the die. The interconnection issue has become even more challenging as these chips are utilizing newer technology nodes to achieve smaller die sizes that are pad limited.

It is conventional to test semiconductor integrated circuits during manufacture to ensure the integrity of the integrated circuits. In one testing technique integrated circuits or dies are tested by establishing electrical current between test equipment such as a tester and each integrated circuit or die. The ability to test the dies in an efficient manner is constantly being reviewed for improvements. It is desirable to be able to increase the throughput of the testing as the die size is shrinking and the pad density is increasing, both of which tend to cause constraints for the testing throughput.

It is within this context that the embodiments described below arise.

SUMMARY

The embodiments described herein provide an integrated circuit having a surface with a probe pad distribution pattern that enables efficient testing of the integrated circuit. It should be appreciated that the present invention can be implemented in numerous ways, such as a process, an apparatus, a system, a device or a method on a computer readable medium. Several inventive embodiments of the present invention are described below.

In one aspect of the invention, an integrated circuit (IC) is provided. The integrated circuit includes a plurality of bond pads disposed on a surface of the IC and a plurality of probe pads disposed on the surface of the IC. Each of the plurality of probe pads is in electrical communication with corresponding bond pads. The plurality of probe pads are linearly configured across the surface of the die. In one embodiment, the probe pads are disposed along a diagonal of the surface of the die defined between opposing vertices of the die surface. In another embodiment, multiple rows of linearly disposed probe pads are provided on the surface. The die may be tested through automated test equipment where the tester includes a probe card that has probe pins which align with the probe pads diagonally disposed along the surface of the die or dies being tested.

In another aspect of the invention, a method of testing a semiconductor device is provided. The method initiates with orienting a plurality of devices under test so that probe pads disposed along diagonally opposing vertices of successive devices under test are substantially linear. The method includes contacting the probe pads with probe pins of a probe card and transmitting electrical signals to the probe pads through the probe pins. Responses initiated by the electrical signals are captured to verify the integrity of the device. In one embodiment, the probe card is a cantilevered probe card.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

The embodiments described herein provide a pad layout for probe pads and wire bonding pads of an integrated circuit. It will be obvious, however, to one skilled in the art, that the present invention may be practiced without some or all of these specific details. In other instances, well known process operations have not been described in detail in order not to unnecessarily obscure the present invention.

The embodiments described herein provide a diagonal redistribution pattern for probe pads in a die to be packaged through wire bonding. The diagonal redistribution pattern enables low-cost schemes for multi-die probing to be performed. As explained in more detail below the redistributed probe pads are arranged in a diagonal across a surface of the die. Under this arrangement, multiple die can be probed with a linear arrangement of probe pins, by aligning the wafer diagonally. The embodiments enable the use of linear probe cards, which are less expensive and produce more reliable measurements. In one embodiment, cantilever probe technology may be utilized for the probe cards performing the testing. One skilled in the art will appreciate that cantilever probe technology has a fixed dimension in one planar direction, but is capable of moving in an orthogonal direction to the plane of the fixed dimension.

Figure 1:
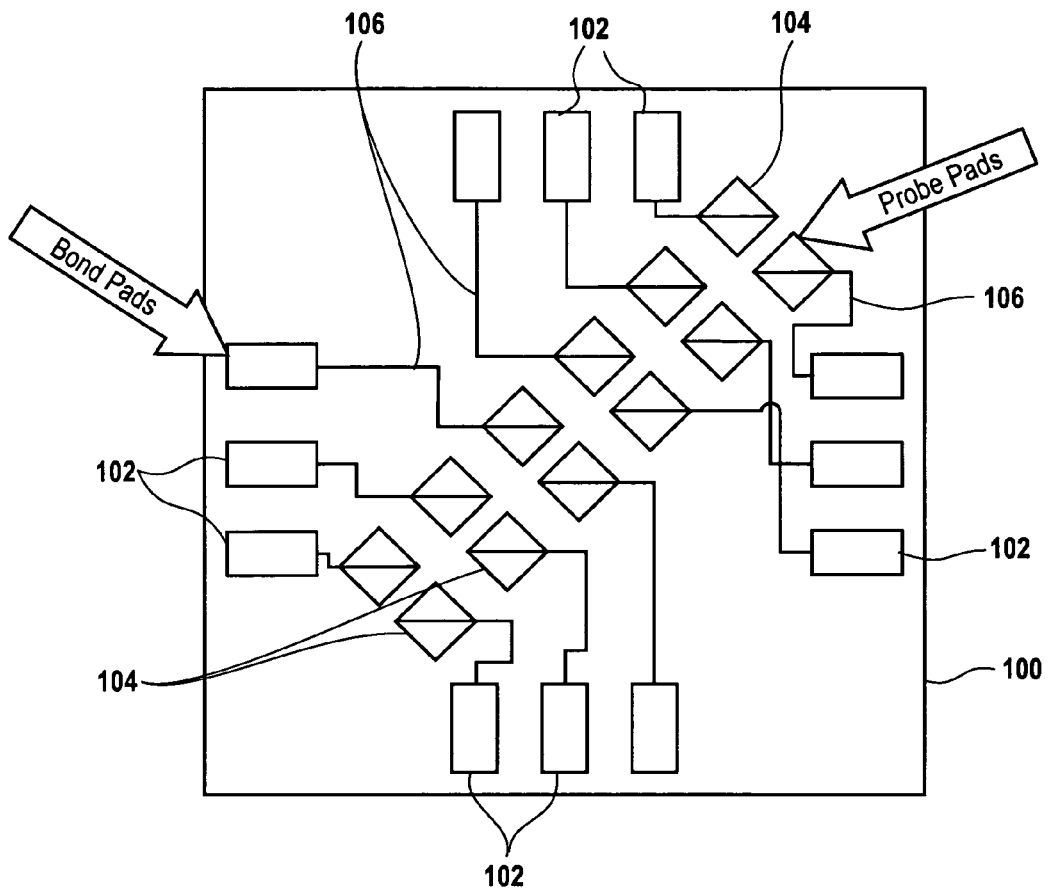
FIG. 1 is a simplified schematic diagram illustrating a surface of a die having the diagonally distributed probe pads in accordance with one embodiment of the invention.

FIG. 1 is a simplified schematic diagram illustrating a surface of a die having the diagonally distributed probe pads in accordance with one embodiment of the invention. Die 100 may be any semiconductor die prepared through known semiconductor manufacturing processes. It should be appreciated that the integrated circuit may be a microprocessor, a programmable logic device (PLD), or other integrated circuits manufactured through semiconductor manufacturing techniques. The surface of die 100 includes a plurality of bond pads 102 disposed along a perimeter of the four sides of die 100. Bond pads 102 are subsequently bonded to a package substrate through wire bonds. Prior to the wire bonding process, die 100 may undergo testing to verify the integrity of the pathways and logic within the integrated circuit. During the testing, the probe pads are contacted through probe pins of a probe card housed within automated testing equipment to stimulate signals into the integrated circuit. The responses to these signals are then captured in order to ensure integrity of die 100. The probe pad distribution illustrated in FIG. 1 enables the efficient testing of die 100. As will be discussed further below multiple dies may be aligned so as to utilize cantilevered probe cards in order to complete the testing. Bond pads 102 are in electrical communication with probe pads 104 through traces 106.

Figure 2A:
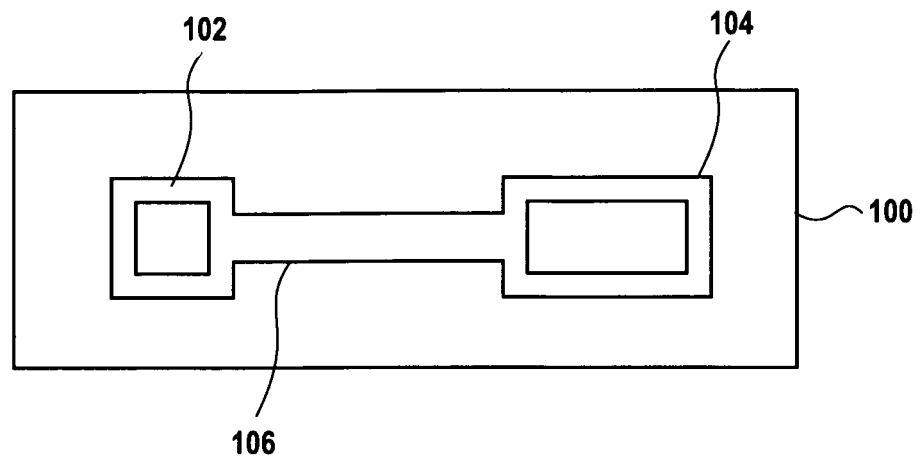
FIG. 2A is a simplified schematic of the interconnection between the bond pads and the probe pads in accordance with one embodiment of the invention.
Figure 2B:
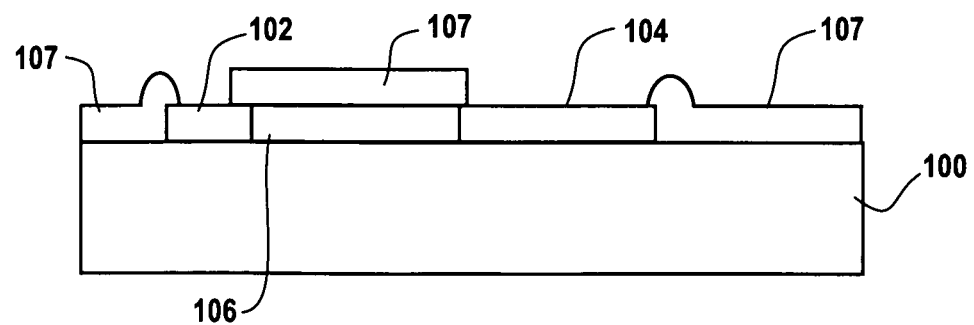
FIGS. 2B and 2C illustrate cross sectional side views of possible interconnections for the bond pads and probe pads of FIGS. 1 and 2A in accordance with one embodiment of the invention.
Figure 2C:
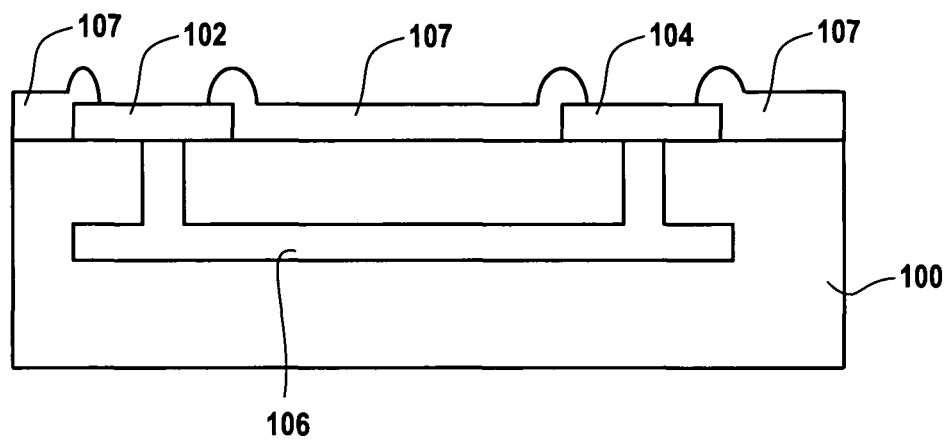

FIG. 2A is a simplified schematic of the interconnection between the bond pads and the probe pads in accordance with one embodiment of the invention. Die 100 includes bond pad 102 and probe pad 104 disposed on a surface of die 100. Probe pad 104 is in electrical communication with bond pad 102 through trace 106. In one embodiment, trace 106 may be disposed along a surface of die 100. In this instance, an insulative or passivation material may be disposed over the surface of die 100 between probe pad 104 and bond pad 102. FIGS. 2B and 2C illustrate cross sectional side views of possible interconnections for the bond pads and probe pads of FIGS. 1 and 2A in accordance with one embodiment of the invention. FIG. 2B illustrates yet another embodiment where trace 106 is disposed on a surface of die 100 to connect probe pad 104 and bond pad 102. Passivation layer 107 is disposed over the die surface and the surface of trace 106, leaving access to probe pad 104 and bond pad 102. It should be appreciated that the various interconnections provided in FIGS. 2A-C are exemplary and not meant to be limiting as alternative interconnections techniques are possible. In addition, multiple techniques may be included in a single die, i.e., some connections may be defined below the surface of the die and others may be defined on the surface. FIG. 2C illustrates trace 106 disposed below the surface of die 100 for connecting bond pad 102 and probe pad 104. On skilled in the art will appreciate that trace 106 connects bond pad 102 and probe pad 104 through the metallization layers within die 100. Passivation layer 107 is disposed over the top surface of die 100 and openings are defined in passivation layer 107 the enable access to a surface of each of bond pad 102 and probe pad 104. It should be appreciated that the shape of the bond pads and the probe pads, while depicted as either square or rectangular, is not meant to be limiting. That is, any suitable geometric shape may be used for the bond pads or probe pads.

Figure 3:
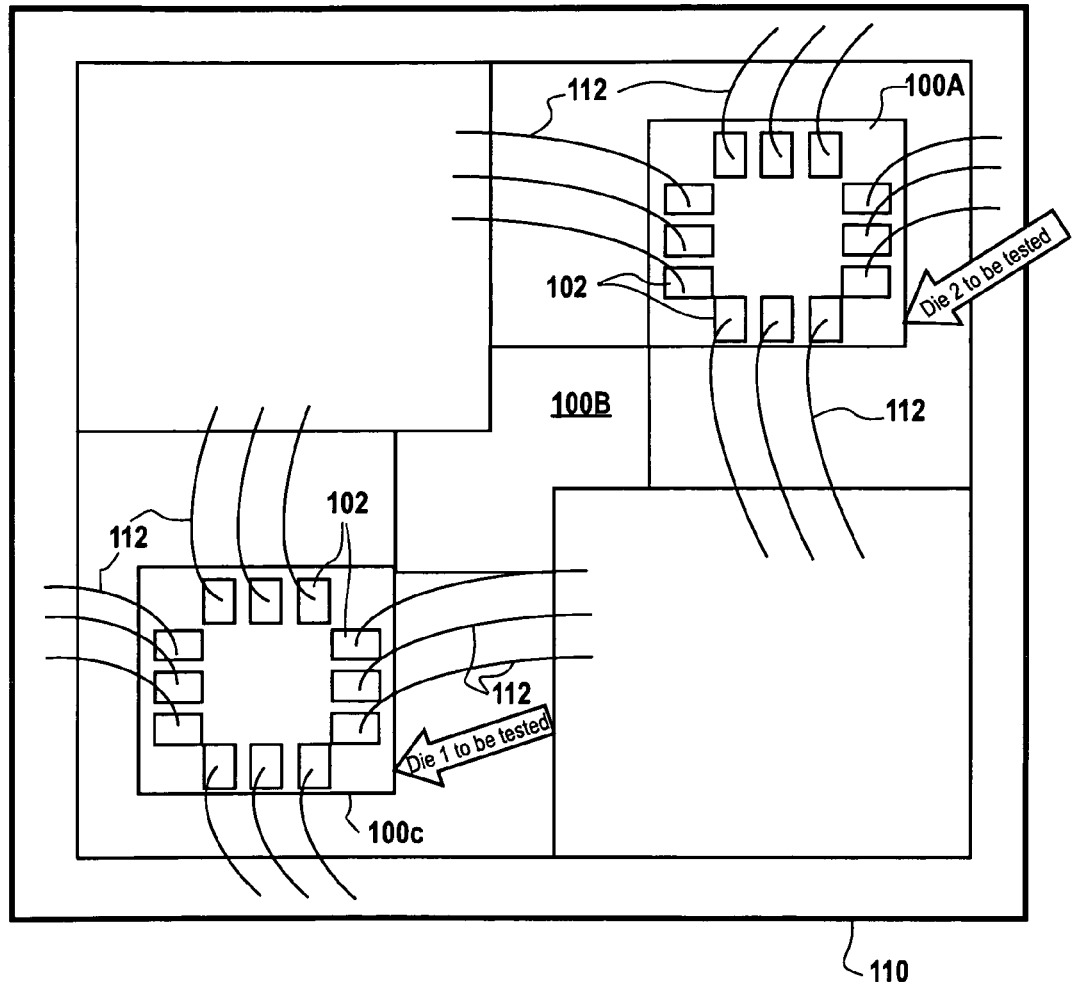
FIG. 3 is a simplified schematic diagram illustrating a two die testing pattern without the diagonal probe pad distribution.

FIG. 3 is a simplified schematic diagram illustrating a two die testing pattern without the diagonal probe pad distribution. Probe card 110 is disposed above dies 100A through 100C. Probe pins 112 contact pads 102 in order to perform the testing. As illustrated in this embodiment, die 100B disposed between die 100A and 100C is skipped. That is, the probe card is unable to access each bond pad for adjacent dies when the distribution pattern is along the periphery of the four sides.

Figure 4A:
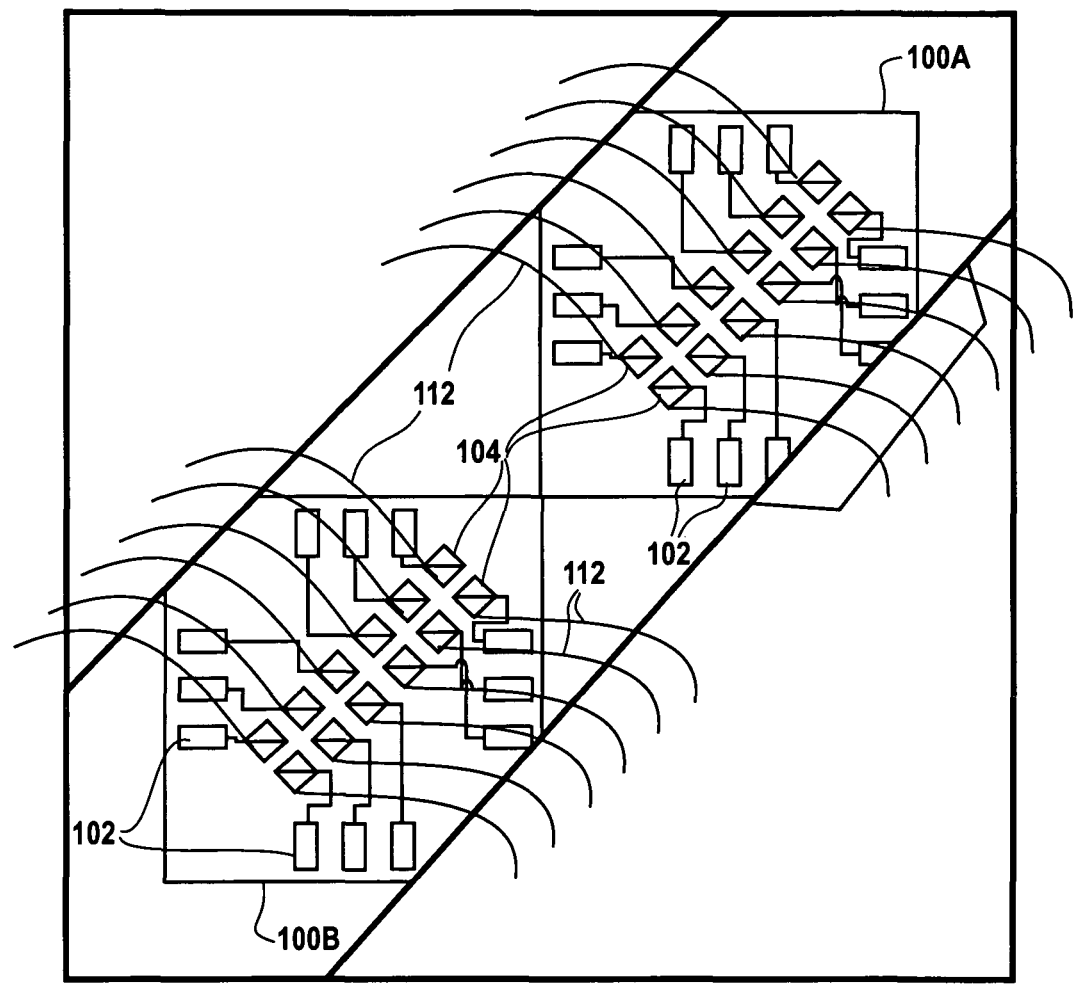
FIG. 4A is a simplified schematic diagram illustrating a multiple die testing pattern with the diagonal probe pad distribution in accordance with one embodiment of the invention.
Figure 4B:
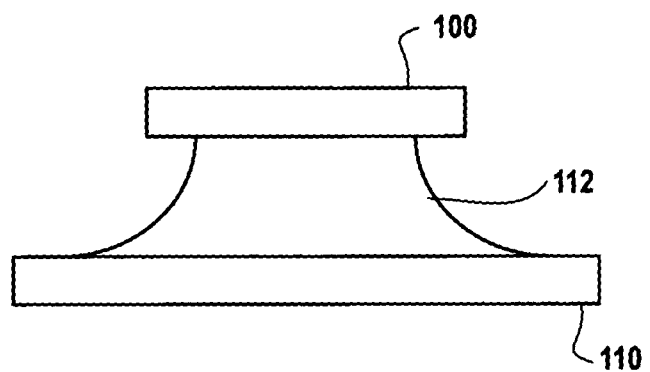
FIG. 4B is a side view of the multi die testing apparatus of FIG. 4A

FIG. 4A is a simplified schematic diagram illustrating a multiple die testing pattern with the diagonal probe pad distribution in accordance with one embodiment of the invention. Dies 100A and 100B are aligned so that the diagonally distributed probe pads 104 are linearly arranged. In addition, probe pads 104 are separate from bond pads 102, yet corresponding probe pads and bond pads are in electrical communication. Probe card 110 contacts the corresponding dies through probe pins 112. As illustrated, the linear arrangement avoids the necessity for skipping dies and thus provides a more efficient testing technique where throughput is improved and relatively inexpensive probe cards may be utilized. It should be appreciated that while two dies 100A and 100B are illustrated, the embodiments are not limited to two dies. That is, more or less than two dies may be tested through the embodiments described herein. FIG. 4B illustrates a side view of the multi die testing apparatus of FIG. 4A. Probe card 110 contacts the die 100 through probe pins 112. In one embodiment, probe pins 112 are cantilevered probe pins. It should be appreciated that the illustration of the probe pins as being curved is for illustrative purposes and that the probe pins, such as cantilevered probe pins are typically linear, i.e., being straight, and may even have a bend defined therein. As illustrated in FIGS. 4A and 4B, the diagonal distribution enables a linear probe card to efficiently test the dies even with the compact probe pad distribution.

Figure 5:
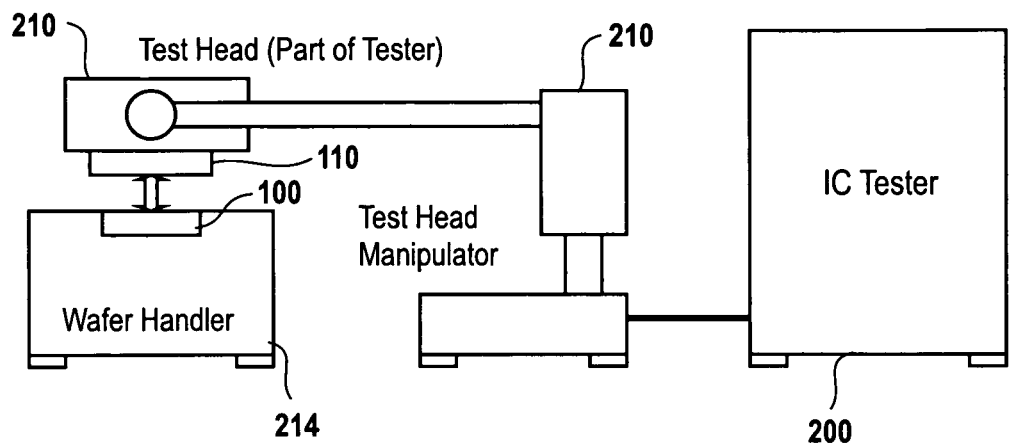
FIG. 5 is simplified schematic diagram illustrating an automated test system for testing multiple dies contemporaneously in accordance with one embodiment of the invention.

FIG. 5 is simplified schematic diagram illustrating an automated test system utilizing the embodiments described herein. The testing system includes integrated circuit tester 200 is in communication with test head manipulator 210, which controls test head 212. Probe card 110 is affixed to test head 212. Wafer handler/die support 214 supports the wafers or dies to be tested. In one embodiment a plurality of dies 100 are arranged in a linear arrangement where the probe pads disposed diagonally along a surface of each die are linearly aligned. Test head 212 is lowered so that probe card 110 contacts the dies 100 to be tested through corresponding probe pins. One skilled in the art will appreciate that alternative configurations depending on the manufacturer of the test system may be utilized and that the embodiments are not limited to the exemplary test system described herein.

Figure 6:
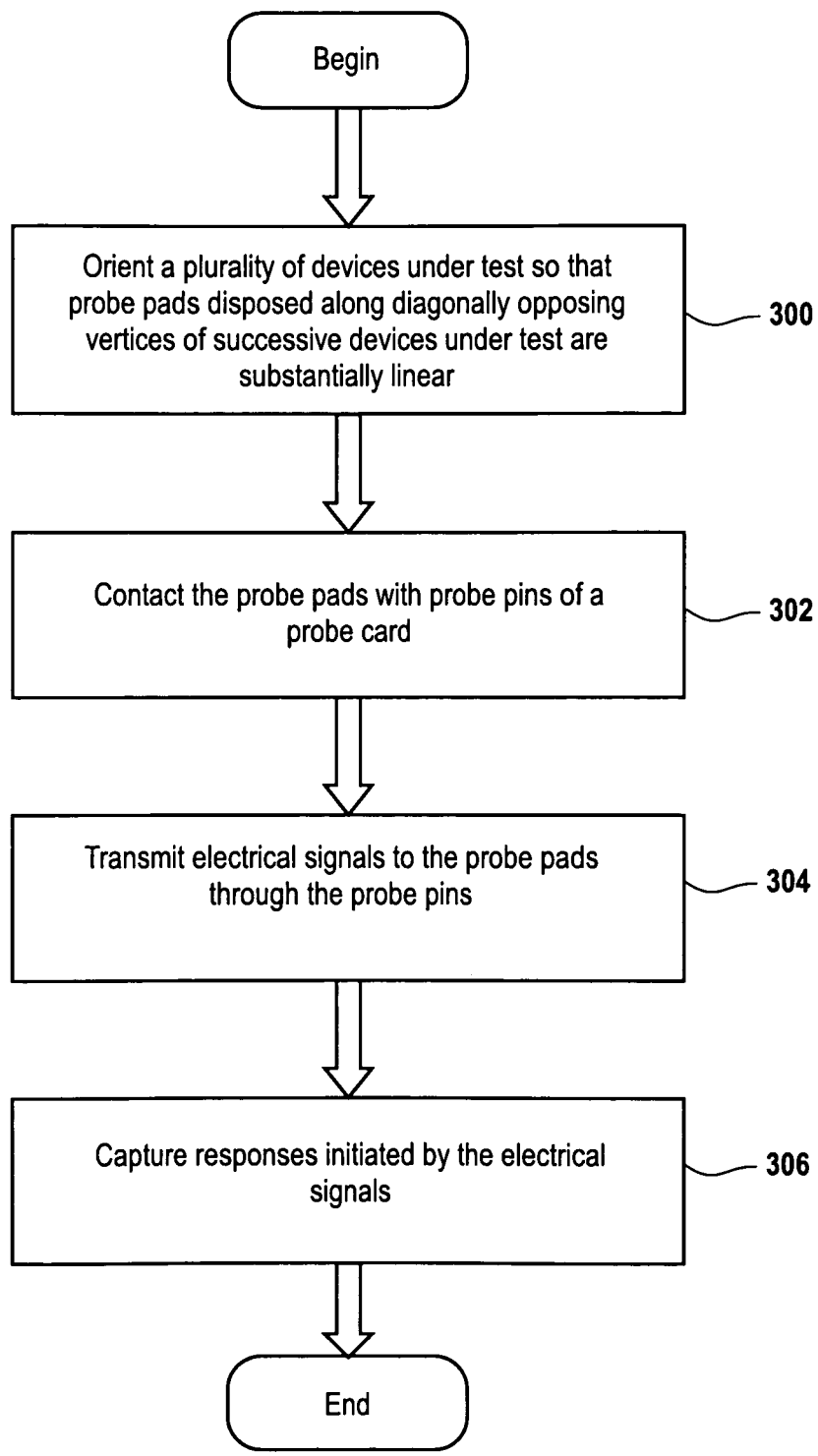
FIG. 6 is a flowchart diagram illustrating method operations for testing a semiconductor device in accordance with one embodiment of the invention.

FIG. 6 is a flowchart diagram illustrating method operations for testing a semiconductor device in accordance with one embodiment of the invention. The method initiates with operation 300 where a plurality of devices under test are oriented so that probe pads disposed along diagonally opposing vertices of successively adjacent devices under test are substantially linear, as illustrated in FIGS. 4A and 4B. The probe card is disposed over the diagonally aligned dies without the need for skipping any of the dies. In one embodiment a cantilevered probe card may be employed in the testing of the semiconductor devices. The method then advances to operation 302 where the probe pads of the die are contacted with the probe pins from the probe card. In operation 304 electric signals are transmitted from the probe card to the probe pads. The responses to the electric signals transmitted to the probe pads are captured or recorded in operation 306. One skilled in the art will appreciate that the captured data can be analyzed to verify the integrity of the semiconductor device or integrated circuit being tested.

In summary, the embodiments provide for a distribution pattern for probe pads disposed on a surface of an integrated circuit. The integrated circuit may be a processor or a programmable logic device in one embodiment. The distribution pattern provides for a linear arrangement of the probe pads along a diagonal extending between opposing vertices of the surface of the integrated circuit.

The embodiments may be utilized for any integrated circuit and are not limited to programmable logic devices. However, where the embodiments are applied to a programmable logic device, the programmable logic device may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

As used herein programmable logic devices refer to any integrated circuit that may be programmed to perform a desired function and include programmable logic arrays (PLAs), programmable array logic (PAL), field programmable gate arrays (FPGA), complex programmable logic devices (CPLDs), and a wide variety of other logic and memory devices that may be programmed. Often, such PLDs are designed and programmed by a design engineer using an electronic design automation tool that takes the form of a software package.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. An integrated circuit (IC), comprising:
   a plurality of bond pads disposed on a surface of the IC;
   a plurality of probe pads diagonally disposed on the surface of the IC, each of the plurality of probe pads in electrical communication with corresponding bond pads, wherein the plurality of probe pads are configured to align with a linear probe card.

2. The IC of claim 1 wherein the linear probe card is diagonally disposed over the integrated circuit, and wherein each bond pad of the plurality of bond pads and each probe pad of the plurality of probe pads are coplanar with each other.

3. The IC of claim 1, wherein the plurality of bond pads are disposed along each peripheral edge of the surface.

4. The IC of claim 1, wherein each of the plurality of probe pads and the corresponding bond pads are in electrical communication through a conductive trace.

5. The IC of claim 4, wherein the conductive trace is disposed one of below the surface of the IC or above the surface of the IC.

6. The IC of claim 2, wherein the plurality of probe pads are distributed along multiple rows.

7. A testing system, comprising:
   a support for supporting a plurality of dies for testing, the plurality of dies linearly oriented such that probe pads diagonally disposed along a surface of each of the plurality of dies are substantially aligned; and
   a linear probe card diagonally disposed over the plurality of dies, the linear probe card having a plurality of probe pins aligned with the probe pads diagonally disposed along the surface of each of the plurality of dies, wherein the linear probe card is operable to concurrently test the plurality of dies.

8. The system of claim 7, wherein the plurality of probe pins is cantilevered.

9. The system of claim 7, wherein the plurality of dies includes multiple rows of probe pads diagonally disposed.

10. The system of claim 7, wherein the plurality of bond pads is in electrical communication with corresponding probe pads, and wherein the plurality of bond pads and the plurality of probe pads are rectangular in shape.

11. The system of claim 10, wherein the bond pads are disposed along a perimeter of the die.

12. The system of claim 9, wherein the plurality of probe pins is arranged in multiple rows.

13. The system of claim 10, wherein the bond pads are in communication with the plurality of probe pads through a conductive trace disposed below the surface.

14. A method of testing a semiconductor device, comprising:
   orienting a plurality of devices under test so that probe pads disposed along a diagonal extending between diagonally opposing vertices of successive devices under test are substantially linearly aligned;
   orienting a linear probe card so as to align probe pins of the linear probe card with the probe pads disposed along the diagonal;
   concurrently contacting the probe pads of the plurality of devices with the probe pins of the linear probe card;
   transmitting electrical signals to the probe pads through the probe pins; and
   capturing responses initiated by the electrical signals.

15. The method of claim 14, wherein each of the probe pads are in electrical communication with a corresponding bond pad.

16. The method of claim 15, wherein each bond pad is disposed along an outer perimeter of each of the devices under test.

17. The method of claim 15, further comprising:
   transmitting the electrical signals along a conductive trace disposed below a surface of the probe pads and corresponding bond pad.

18. The method of claim 14 wherein the capturing includes storing the responses on a computer readable storage medium.

* * * * *